United States Patent
Do et al.

(10) Patent No.: US 6,504,769 B2
(45) Date of Patent: Jan. 7, 2003

(54) SEMICONDUCTOR MEMORY DEVICE EMPLOYING ROW REPAIR SCHEME

(75) Inventors: Chang-Ho Do, Ichon-shi (KR); Jung-Won Suh, Ichon-shi (KR)

(73) Assignee: Hynix Semiconductor Inc.

( * ) Notice: Subject to any disclaimer, the term of this patent is extended or adjusted under 35 U.S.C. 154(b) by 0 days.

(21) Appl. No.: 09/745,491

(22) Filed: Mar. 12, 2001

(65) Prior Publication Data

US 2001/0023093 A1 Sep. 20, 2001

(30) Foreign Application Priority Data

Dec. 24, 1999 (KR) .......................................... 99 62228

(51) Int. Cl.$^7$ ................................................ G11C 7/00
(52) U.S. Cl. ................ 365/200; 365/230.03; 365/225.7
(58) Field of Search ............................. 365/200, 230.03, 365/225.7, 230.06

(56) References Cited

U.S. PATENT DOCUMENTS 5,798,973 A * 8/1998 Isa .............................. 365/200

FOREIGN PATENT DOCUMENTS

JP 06044795 * 2/1994

* cited by examiner

*Primary Examiner*—A. Zarabian
(74) *Attorney, Agent, or Firm*—Townsend and Townsend and Crew LLP

(57) ABSTRACT

A semiconductor memory device having a plurality of cell blocks includes: a fuse box group, coupled to the cell blocks, for generating a repair signal in response to a row address signal; a repair signal summation unit for generating a repair summation signal for controlling a repair operation in response to the repair signal; a block selection signal generation unit for generating a block selection signal for selecting a cell block to be repaired in response to the repair summation signal and a block selection address signal; and a repair row decoding unit for driving a redundant word line in response to the repair signal and a block selection signal.

25 Claims, 7 Drawing Sheets

//www.w3.org/1999/xhtml">
SEMICONDUCTOR MEMORY DEVICE EMPLOYING ROW REPAIR SCHEME

FIELD OF THE INVENTION

The present invention relates to a semiconductor memory device; and, more particularly to a semiconductor memory device employing a row repair scheme, capable of improving a repair efficiency and obtaining a stable operation regardless of variations in external factors.

DESCRIPTION OF THE PRIOR ART

Generally, a manufacturing cost in a semiconductor memory device depends on a total yield. Therefore, for increasing the total yield, spare memory cells are inserted into the semiconductor memory device. Thus, if a specific defective memory cell is detected, the defective memory cell is replaced with the spare memory cell.

FIG. 1 is a schematic diagram showing a semiconductor memory device employing a conventional row repair scheme. For the sake of convenience, it is assumed that there are eight cell blocks.

As shown, the semiconductor memory device includes four fuse boxes 100 to 104, eight redundant word line selectors 105 to 112 and eight cell blocks BLK0 to BLK7.

Each of the cell blocks BLK0 to BLK7 includes four redundant word lines R_WL0 to R_WL3 disposed in a row direction. Each of the fuse boxes 100 to 104 includes four fuse elements, and the fuse boxes 100 to 104 generate repair signals REP_0 to REP_3, respectively. Each of the repair signals REP_0 to REP_3 corresponds to the redundant word lines R_WL0 to R_WL3. The redundant word line selectors 105 to 112 drive the redundant word lines R_WL0 to R_WL3 in response to block selection address signals BLK_ADD<0:7>.

Hereinafter, an operation of the conventional row repair scheme will be described with reference to FIG. 1.

A row address signal is inputted to all of the fuse boxes 101 to 104, and a specific cell block is selected in response to the block selection address signals BLK_ADD<0:7>. At this time, in case where there is no defective word line having a fail bit in the selected cell block, a normal word line is activated.

Meanwhile, in case where there is a defective word line, one of the four fuse boxes 101 to 104 is programmed to activate one repair signal. The repair signal is inputted to the redundant word line selectors 105 to 112. Then, the normal word line is inactivated and the redundant word line is activated.

If there is another defective word line, another fuse box is programmed and the defective word line is replaced with another redundant word line.

As described above, in the conventional repair scheme, the redundant word lines contained in the selected cell block are activated. Accordingly, if the number of defective word lines is greater than that, of redundant word lines, it is impossible to achieve a replacement of the defective word lines.

SUMMARY OF THE INVENTION

It is, therefore, an object of the present invention to provide a semiconductor memory device employing a row repair scheme, capable of improving a repair efficiency and obtaining a stable operation regardless of variations in external factors.

In accordance with an aspect of the present invention, there is provided a semiconductor memory device having a plurality of cell blocks, comprising: a fuse box group, coupled to the cell blocks, for generating a repair signal in response to a row address signal; a repair signal summation means for generating a repair summation signal for controlling a repair operation in response to the repair signal; a block selection signal generation means for generating a block selection signal for selecting a cell block to be repaired in response to the repair summation signal and a block selection address signal; and a repair row decoding means for driving a redundant word line in response to the repair signal and a block selection signal.

BRIEF DESCRIPTION OF THE DRAWINGS

Other objects and aspects of the invention will become apparent from the following description of the embodiments with reference to the accompanying drawings, in which.

DETAILED DESCRIPTION OF THE PREFERRED EMBODIMENTS

Figure 1:
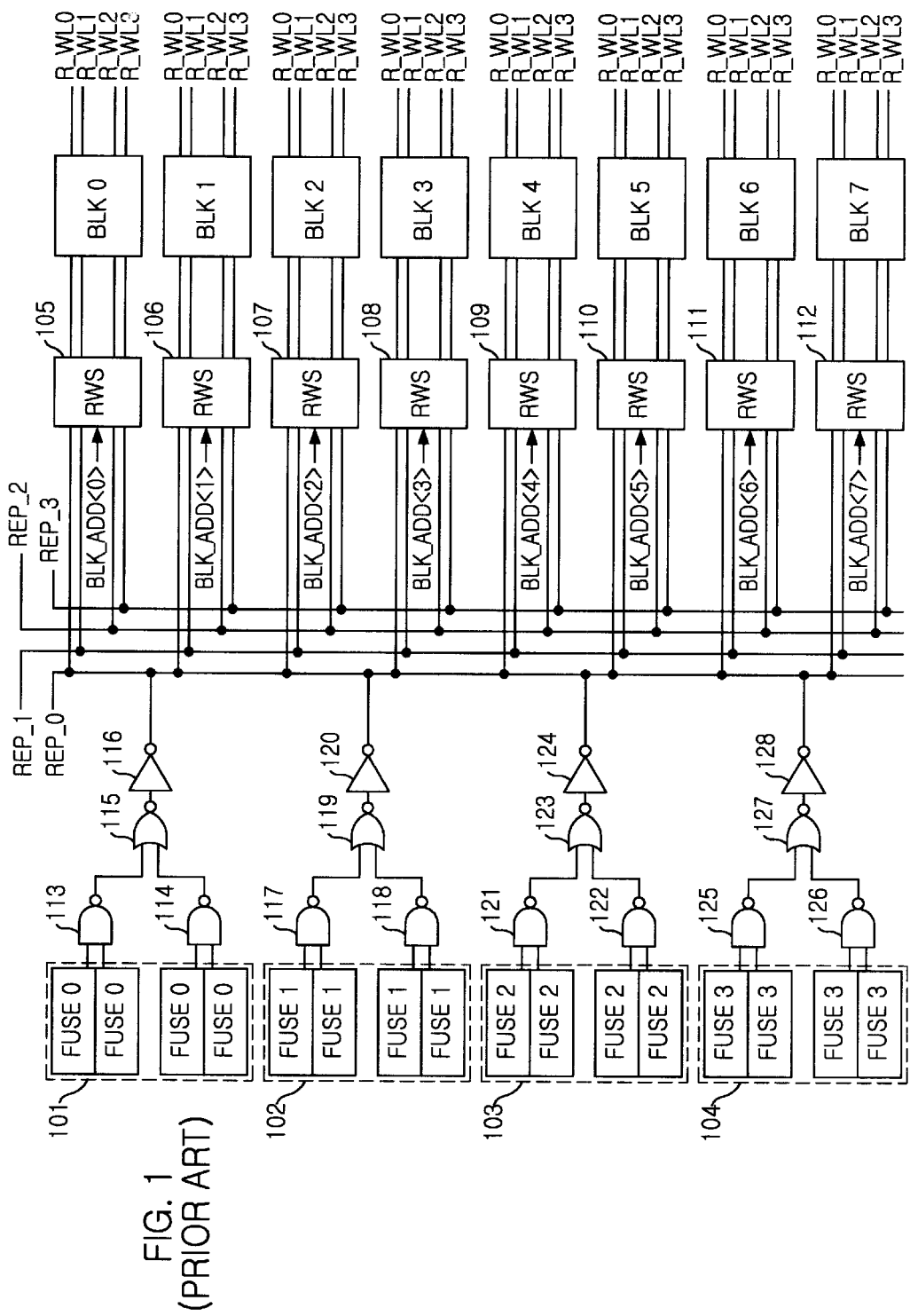
FIG. 1 is a schematic diagram showing a semiconductor memory device employing a conventional row repair scheme.
Figure 2:
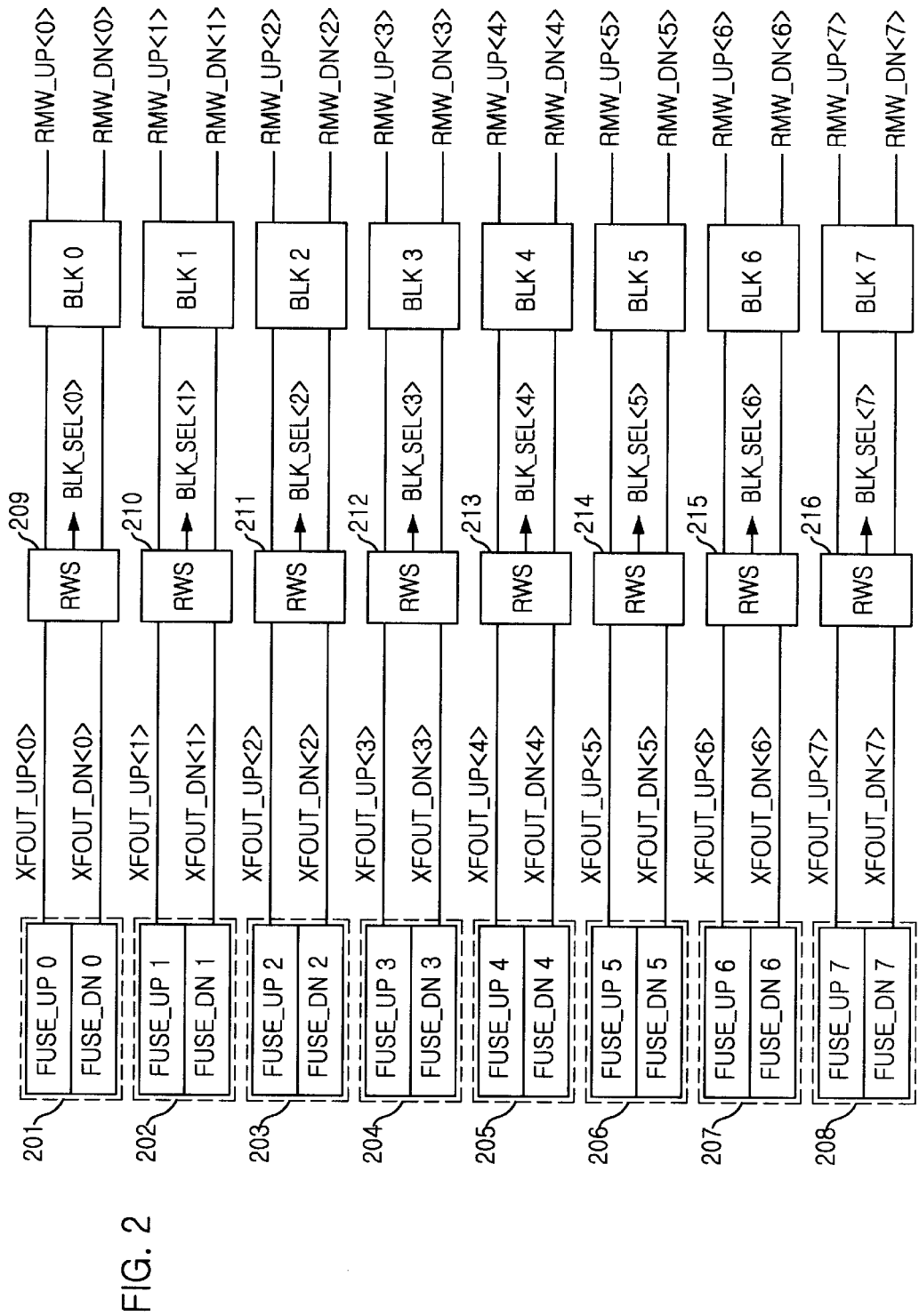
FIG. 2 is a block diagram illustrating a semiconductor memory device employing a row repair scheme in accordance with the present invention.

FIG. 2 is a block diagram illustrating a semiconductor memory device employing a row repair scheme in accordance with the present invention. Here, for the sake of convenience, it is assumed that there are eight cell blocks BLK0 to BLK7.

Referring to FIG. 2, the semiconductor memory device employing a row repair scheme includes eight fuse boxes 201 to 208, eight cell blocks BLK0 to BLK7 and eight row decoders 209 to 216.

The fuse boxes 201 to 208 generate repair signals XFOUT_UP<0:7> and XFOUT_DN<0:7> respectively. Each of the cell blocks BLK0 to BLK7 has pairs of redundant word lines RMW_UP<0:7> and RMW_DN<0:7> in upper and lower portions thereof. Each of the row decoders 209 to 216 drives corresponding redundant word lines RMW_UP<0:7> and RMW_DN<0:7> in response to the repair signals XFOUT_UP<0:7> and XFOUT_DN<0:7>, respectively.

Figure 3:
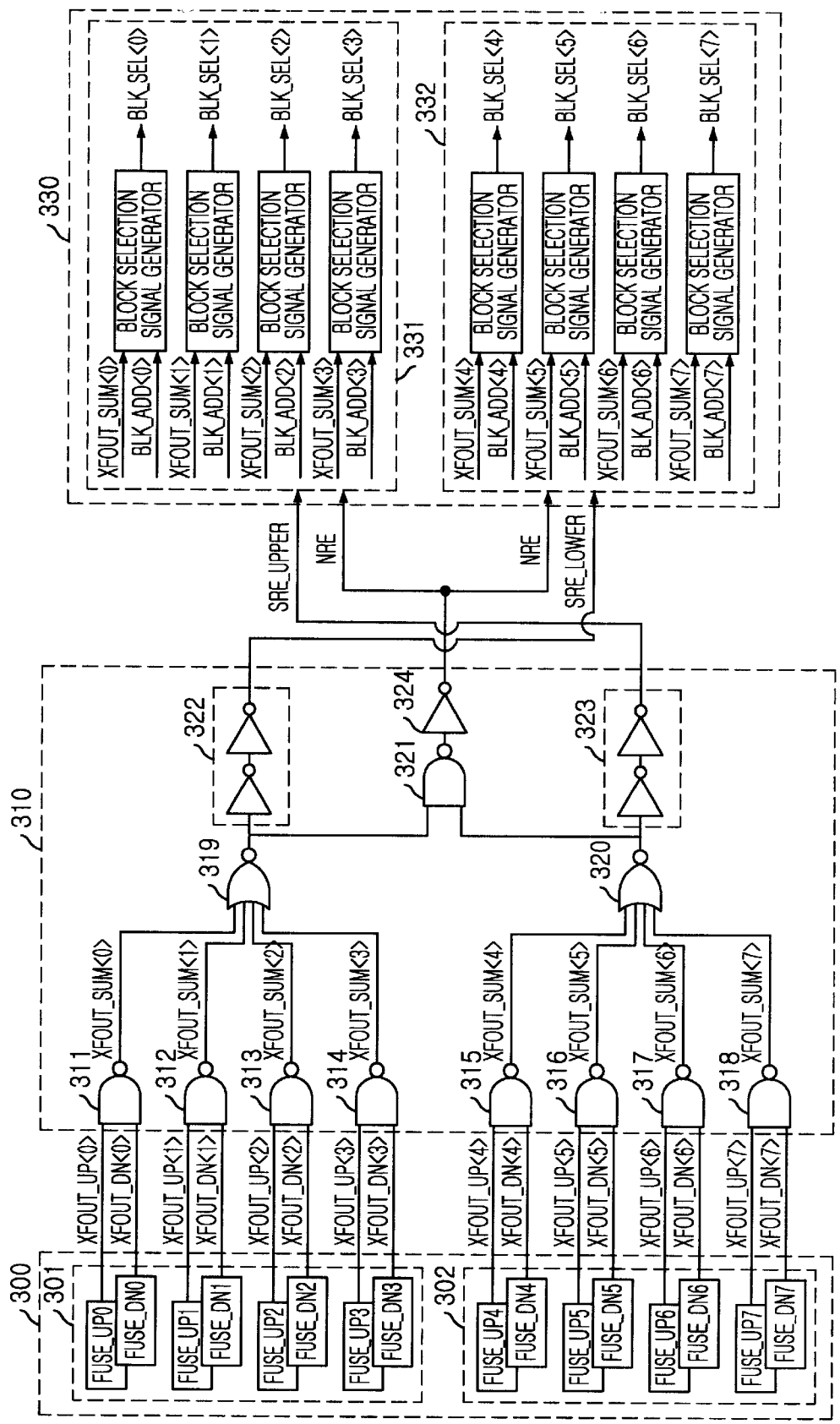
FIG. 3 is a schematic diagram illustrating the semiconductor memory device shown in FIG. 2.

FIG. 3 is a schematic diagram illustrating the semiconductor memory device shown in FIG. 2.

Referring to FIG. 3, the semiconductor memory device includes a fuse box group 300 having pairs of fuse boxes FUSE_UP<0:7> and FUSE_DN<0:7>, a repair signal summation unit 310 and a block selection signal generation unit 330.

The repair signal summation unit 310 logically sums each output of the fuse boxes to stop an operation of the row decoders 209 to 216 and drive an operation of the row repair scheme.

In the repair signal summation unit 310, NAND gates 311 to 318 perform a NAND operation of the repair signals XFOUT_UP<0:7> and XFOUT_DN<0:7> to output repair summation signals XFOUT_SUM<0:7>, respectively. For example, the NAND gate 311 performs a NAND operation of the repair signals XFOUT_UP<0> and XFOUT_DN<0> to output the repair summation signal XFOUT_SUM<0>.

The repair summation signals XFOUT_SUM<0:3> are NORed through a first NOR gate 319, and the repair summation signals XFOUT_SUM<0:7> are NORed through a second NOR gate 320. Then, outputs of the first and the second NOR gates 319 and 320 are NANDed through a NAND gate 321, and an output of the NAND gate 321 is inverted through an inverter 324 to thereby obtain a normal row enable signal NRE. The output of the first NOR gate 319 is buffered through a buffer unit 322 to thereby obtain a lower spare row enable signal SRE_LOWER, and the output of the second NOR gate 320 is buffered through a buffer unit 323 to generate a upper spare row enable signal SRE_UPPER.

The normal row enable signal NRE is used to determine a timing for selecting cell blocks in a normal operation, and the spare row enable signals SRE_LOWER and SRE_UPPER are used to determine a timing of cell blocks in a repair operation. At this time, the repair signal summation unit 310 makes a timing of the normal row enable signal NRE equal to that of the spare row enable signals SRE_LOWER and SRE_UPPER, so that a word line enable timing becomes equal in the normal operation and in the repair operation.

In FIG. 3, a block selection signal generation unit 330 includes an upper block selection signal generation unit 331 and a lower block selection signal generation unit 332.

The upper block selection signal generation unit 331 receives the upper spare row enable signal SRE_UPPER, the repair summation signals XFOUT_SUM<0:3> and the block 5 selection address signals BLK_ADD<0:3> to generate the block selection signals BLK_SEL<0:3>. In similar manner, the lower block selection signal generation unit 332 receives the lower spare row enable signal SRE_LOWER, the repair summation signals XFOUT_SUM<0:7> and the block selection address signals BLK_ADD<0:7> to generate the block selection signals BLK_SEL<0:7>

With respect to an operation of the block selection signal generation unit 330, in an initial state, the entire repair signals XFOUT_UP<0:7> and XFOUT_DN<0:7> are set to logic low levels. Thus, the normal row enable signal NRE and the spare row enable signals SRE_UPPER and SRE_LOWER are maintained at logic low levels, and the repair summation signals XFOUT_SUM<0:7> are maintained at logic high levels.

Then, in a state of a normal operation, the entire repair signals XFOUT_UP<0:7> and XFOUT_DN<0:7> are transited to logic high levels. Therefore, the repair summation signals XFOUT_SUM<0:7> are transited to logic low levels, and the normal row enable signal NRE and the spare row enable signals SRE_UPPER and SRE_LOWER are transited to logic high levels.

Then, in a state of a repair operation, one output of a specific fuse box corresponding to a redundant word line to be used is maintained at the logic low level, and the other outputs are transited to the logic high levels. For example, in case where a fuse box corresponding to a sixth cell block BLK5 is programmed to be used as a redundant word line, only the repair summation signal XFOUT_SUM<5> is maintained at the logic low level, and the other repair summation signals XFOUT_SUM<0:4> and XFOUT_SUM<6:7> are transited to the logic high levels.

At this time, if a fuse box contained in a lower fuse box group 302 is programmed, the upper spare row enable signal SRE_UPPER and the normal row enable signal NRE are kept on at the logic low level. Meanwhile, the lower spare row enable signal SRE_LOWER is transited to the logic high level.

Figure 4:
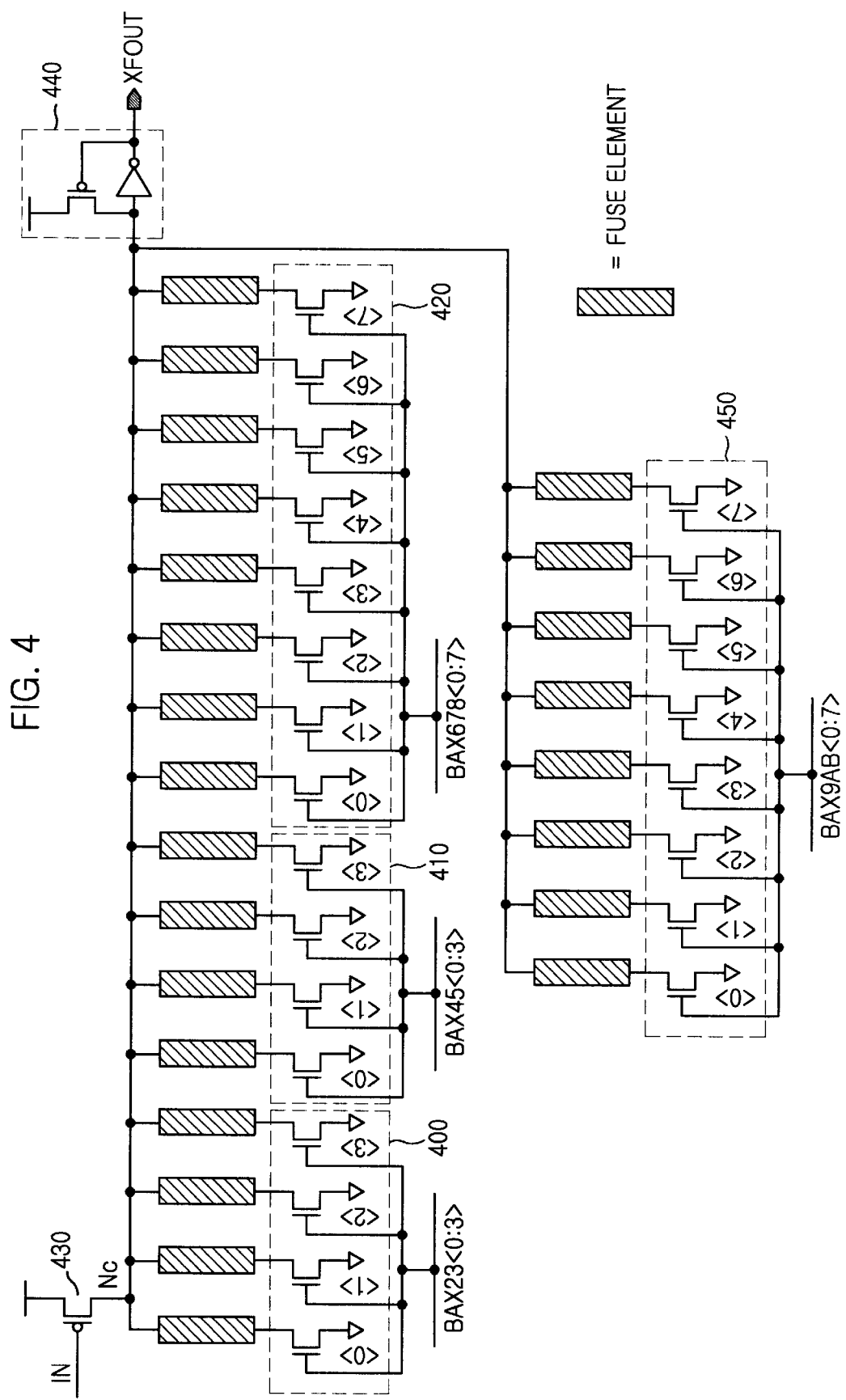
FIG. 4 is a circuit diagram illustrating the fuse box shown in FIG. 3.

FIG. 4 is a circuit diagram illustrating the fuse box shown in FIG. 3.

Referring to FIG. 4, the fuse box includes a plurality of fuse elements, a plurality of NMOS transistors 400, 410, 420 and 450 and a latch unit 440. Additionally, the fuse box includes a PMOS transistor 430, coupled between a power terminal and a common node Nc, whose gate receives a fuse precharge signal IN. The fuse elements are coupled to respective NMOS transistors, each of whose gates receives the word line selection address signals BAX23<0:3>, BAX45<0:3>, BAX678<0:7> and BAX9AB<0:7>. The latch unit 440 latches and outputs a voltage level applied to the common node Nc as the repair signal XFOUT.

In an initial state, the fuse precharge signal IN inputted to the PMOS transistor 430 is set to a logic low level, and the word line selection address signals BAX23<0:3>, BAX45<0:3>, BAX678<0:7> and BAX9AB<0:7> inputted to the NMOS transistors 400, 410, 420 and 450 are set to logic low levels. Thus, due to a pull-up operation of the PMOS transistor 430, the common node Nc and the repair signal XFOUT are maintained to a logic high level and a logic low level, respectively.

Then, in a word line activation operation, the fuse precharge signal IN is changed to a logic high level, the word line selection address signals BAX23<0:3>, BAX45<0:3>, BAX678<0:7> and BAX9AB<0:7>, i.e., decoded row address signals, are inputted. At this time, if a specific word line selected by the word line selection signals is normal, there exists at least one fuse that is not blown out. Therefore, by a pull-down operation of the NMOS transistors 400, 410, 420 and 450, the voltage levels of the common node Nc and the repair signal XFOUT are transited to a logic low level and a logic high level, respectively.

If the selected word line is defective, in a fuse box corresponding to a redundant word line to be used, all fuses, which are coupled to the NMOS transistors 400, 410, 420 and 450 activated by the row address signals, are blown out, so that the common node Nc is maintained to a logic high level due to a PMOS transistor, contained in the latch unit 440, whose gate receives the repair signal XFOUT. Furthermore, the repair signal XFOUT is maintained to a logic low level, thereby informing that the row address signals corresponding to the defective word line are inputted.

Then, in a word line inactivation operation, the word line selection address signals BAX23<0:3>, BAX45<0:3>, BAX678<0:7> and BAX9AB<0:7> are initialized to the logic low levels. Thereafter, the fuse precharge signal IN is also initialized to the logic low level, thereby precharging the common node Nc and the repair signal XFOUT.

Figure 5:
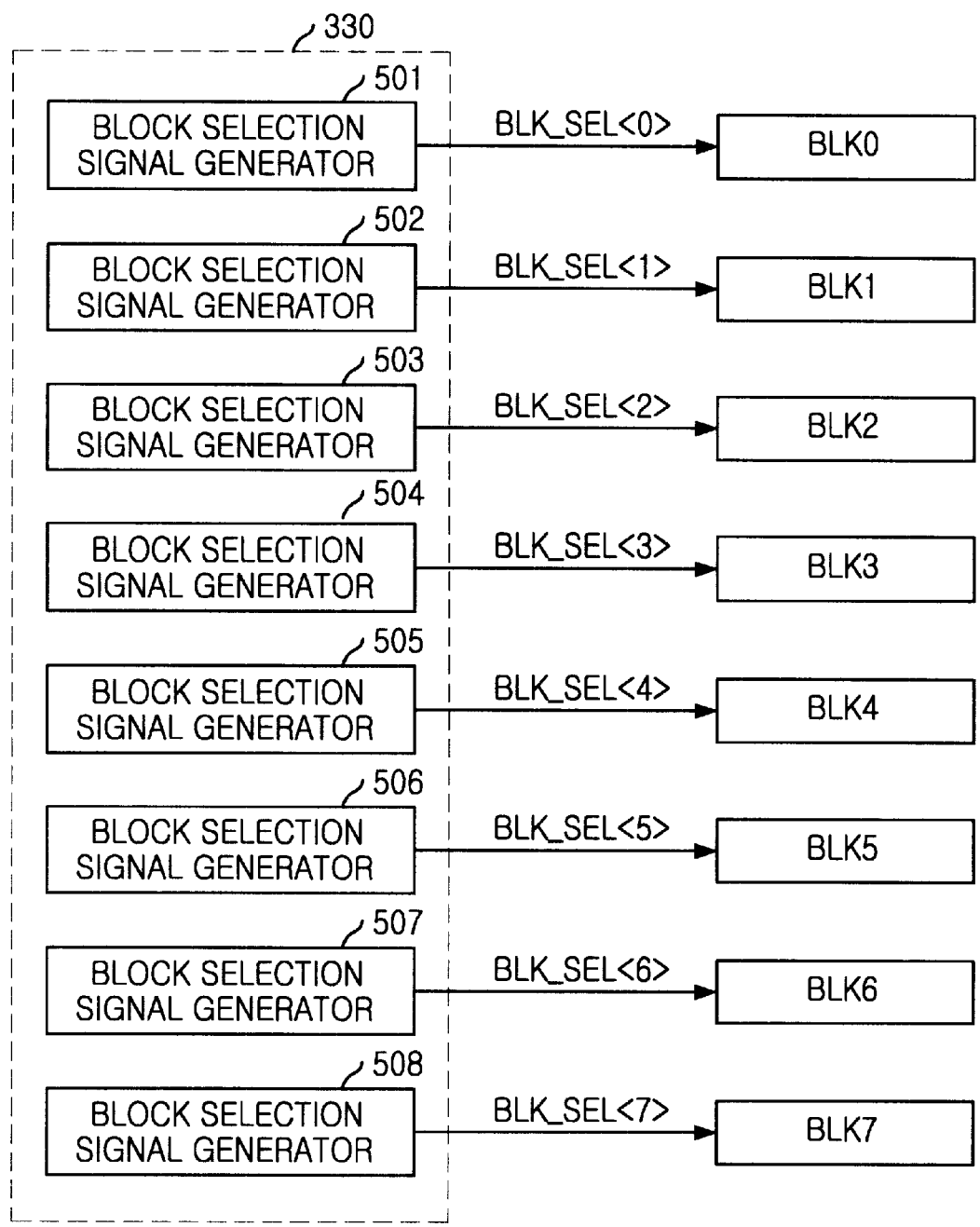
FIG. 5 is a block diagram illustrating the block selection signal generation unit and the cell blocks shown in FIG. 3.

FIG. 5 is a block diagram illustrating the block selection signal generation unit 330 and the cell blocks BLK0 to BLK7.

Referring to FIG. 5, each of the block selection signal generators 501 to 508 is coupled to corresponding cell blocks BLK0 to BLK7. In the normal word line operation, a specific cell block is selected in response to the row address signals, and in the repair operation, a specific cell block having a redundant word line is selected in response to the block selection signal BLK_SEL<0:7> outputted from the block selection signal generation unit 330.

Figure 6:
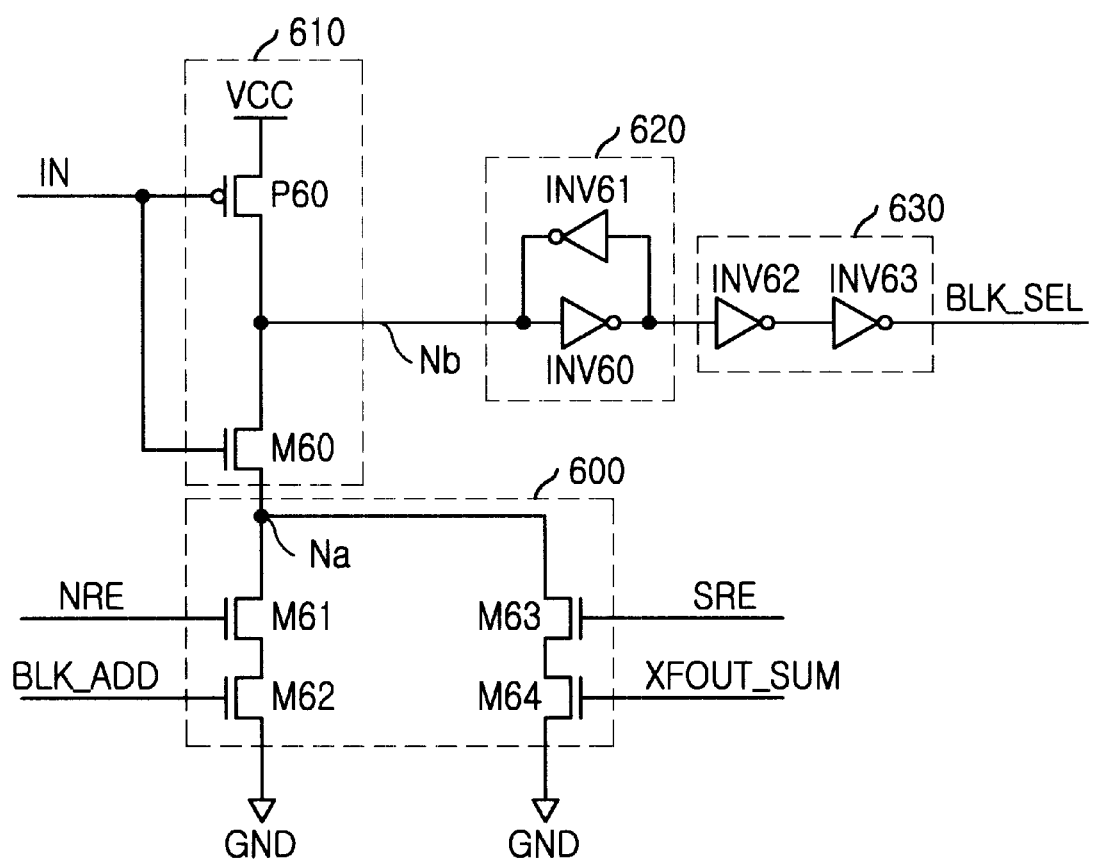
FIG. 6 is a circuit diagram illustrating the block selection signal generation unit shown in FIG. 5.

FIG. 6 is a circuit diagram illustrating the block selection signal generation unit 330.

Referring to FIG. 6, each block selection signal generator contained in the block selection signal generation unit 330 includes an input unit 600, a control unit 610, a latch unit 620 and a buffer unit 630.

The input unit 600 selects a corresponding cell block in response to the normal row enable signal NRE, the spare row enable signal SRE, the repair summation signal XFOUT_SUM and the block selection address signal BLK_ADD.

The control unit 610 controls an operation of the block selection signal generator in response to the fuse precharge signal IN.

The latch unit 620 latches an output of the control unit 610, and the buffer unit 630 buffers an output of the latch unit 620 to generate the block selection signal BLK_SEL.

The input unit 600 includes: a first and a second NMOS transistors M61 and M62, serially coupled between a node Na and a ground potential GND, each of whose gates receive the normal row enable signal NRE and the block selection address signal BLK_ADD, respectively; and a third and a fourth NMOS transistors M63 and M64, coupled between the node Na and the ground potential GND, each of whose gates receive the spare row enable signal SRE and the repair summation signal XFOUT_SUM, respectively.

The control unit 610 includes: a PMOS transistor P60 coupled between a power potential VCC and a node Nb, whose gate receives the fuse precharge signal IN; and a fifth NMOS transistor M60, coupled between the node Nb and the node Na, whose gate receives the fuse precharge signal IN.

The latch unit 620 includes: a first inverter INV60 whose input terminal is coupled to the node Nb, and a second inverter INV61 whose input terminal is coupled to an output terminal of the first inverter INV60 and whose output terminal is coupled to the input terminal of the first inverter INV60.

The buffer unit 630 includes a predetermined number of inverters INV62 and INV63.

Figure 7A:
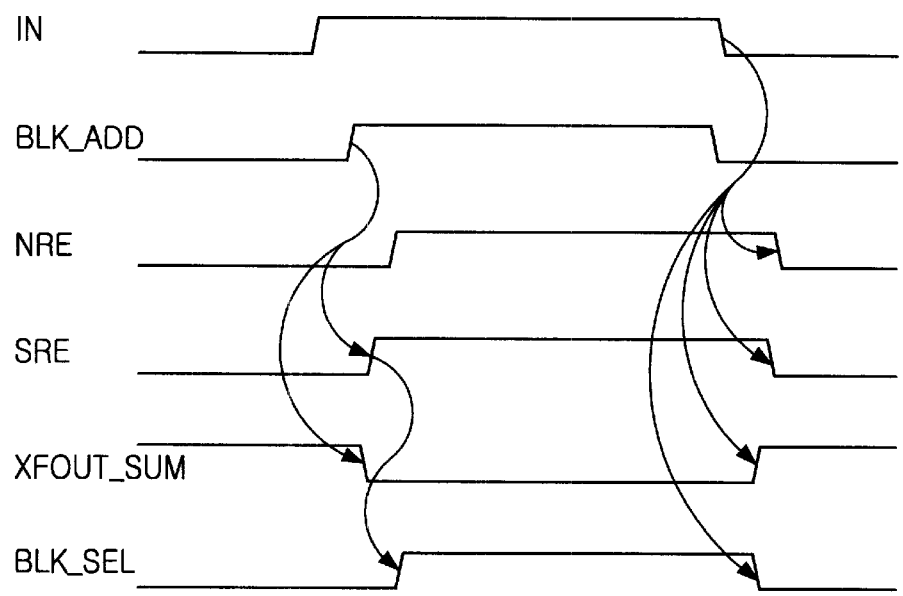
FIGS. 7A and 7B are timing charts illustrating an operation of the block selection signal generation unit shown in FIG. 6.
Figure 7B:
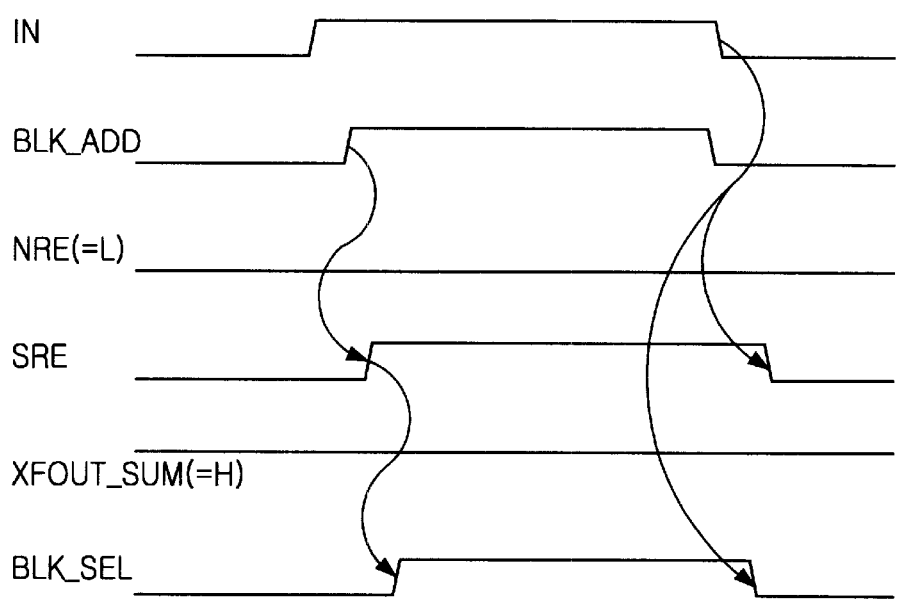

Hereinafter, an operation of the block selection signal generation unit 330 will be described with reference to FIGS. 7A and 7B.

In the initial state, the repair summation signal XFOUT_SUM is set to a logic high level and the other input signals are set to logic low levels. Therefore, the block selection signal BLK_SEL is also maintained to a logic low level.

In the word line activation operation, the fuse precharge signal IN is transited to a logic high level, and then, the block selection address signal BLK_ADD is transited to a logic high level.

At this time, in case of the normal operation, the normal row enable signal NRE is transited to a logic high level, so that a specific cell block corresponding to the block selection address signal BLK_ADD is selected. Meanwhile, although the spare row enable signal SRE is also transited to a logic high level, there is no influence on the output of the block selection signal generator since the repair summation signal XFOUT_SUM is already transited to a logic low level.

Additionally, since one of eight block selection address signals BLK_ADD<0:7> is activated, only one of eight block selection signal BLK_SEL<0:7> is also activated so that one cell block is selected.

In the repair operation, since the normal row enable signal NRE is maintained in an initial state, i.e., the logic low level, an activation of the block selection signal generator is prevented. Additionally, the repair summation signal XFOUT_SUM, which is outputted from one fuse box group containing a specific cell block having a redundant word line to be used, is maintained in a logic high level and inputted to corresponding block selection signal generator.

At this time, the lower or upper spare row enable signal SRE_UPPER or SRE_LOWER outputted from the other fuse box group is transited to a logic high level, so that corresponding block selection signal BLK_SEL is enabled to a logic high level to thereby select a specific cell block having the redundant word line to be used.

As described above, since one fuse box can repair four defective word lines and the defective word lines can be replaced with the redundant word lines contained in the other cell blocks having no defective word line, the number of defective word lines that can be replaced is equal to the number of fuse boxes, a repair efficiency of the fuse boxes is remarkably improved. As a result, the improved repair efficiency leads to an increase of yield and a reduction of manufacturing cost.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A semiconductor memory device having a plurality of cell blocks, comprising:
   a fuse box group, coupled to the cell blocks, for generating a repair signal in response to a row address signal, the fuse box group including upper fuse box pairs and lower fuse box pairs;
   a repair signal summation means for generating a repair summation signal for controlling a repair operation in response to the repair signal, wherein the repair signal summation means includes:
      a plurality of first NAND gates for NANDing outputs of the upper fuse box pairs to provide a first repair summation signal;
      a plurality of second,NAND gates for NANDing outputs of the lower fuse box pairs to provide a second repair summation signal;
      a first NOR gate for NORing outputs of the first NAND gates;
      a second NOR gate for NORing outputs of the second NAND gates;
      a third NAND gate for NANDing an output of the first NOR gate and an output of the second NOR gate;
      a first buffer unit for buffering an output of the first NOR gate to generate a lower spare row enable signal;
      a second buffer unit for buffering an output of the second NOR gate to generate an upper spare row enable signal; and
      an inverter for inverting an output of the third NAND gate to generate a normal row enable signal;
   a block selection signal generation means for generating a block selection signal for selecting a cell block to be repaired in response to the first and second repair summation signals and a block selection address signal; and a repair row decoding means for driving a redundant word line in response to the repair signal and a block selection signal.

2. The semiconductor memory device as recited in claim 1, wherein the fuse box group includes:
   a plurality of upper fuse box pairs, each of the upper fuse box pairs having redundant word line pairs; and
   a plurality of lower fuse box pairs, each of the lower fuse box pairs having redundant word line pairs.

3. The semiconductor memory device as recited in claim 2, wherein the block selection signal generation means includes:
   an upper block selection signal generation unit for receiving the lower spare row enable signal, the normal row enable signal, the first repair summation signal, and an upper block selection address signal and generating a first block selection signal for selecting an upper cell block to be repaired; and
   a lower block selection signal generation unit for receiving the upper spare row enable signal, the normal row enable signal, the second repair summation signal, and a lower block selection address signal and generating a second block selection signal for selecting a lower cell block to be repaired.

4. The semiconductor memory device as recited in claim 2, wherein each fuse box includes:
   a plurality of fuse elements, each having a first terminal coupled to a common node;
   a plurality of NMOS transistors, each NMOS transistor being coupled to a second terminal of a respective one the fuse elements and having a gate terminal coupled to receive a word line selection address signal;
   a PMOS transistor, coupled between a power terminal and the common node, having a gate terminal coupled to receive a fuse precharge signal; and
   a latch unit for latching and providing a voltage level applied to the common node.

5. The semiconductor memory device as recited in claim 4, wherein the latch unit includes:
   an inverter for inverting the voltage level applied to the common node; and
   a second PMOS transistor, coupled between the power terminal and the common node, having a gate terminal coupled to an output terminal of the inverter.

6. The semiconductor memory device as recited in claim 3, wherein the block selection signal generation means includes:
   an input unit for selecting a corresponding cell block in response to the normal row enable signal, at least one of the lower and upper spare row enable signals, at least one of the first and second repair summation signals, and the block selection address signal;
   a control unit for controlling an operation of the block selection signal generation means in response to the fuse precharge signal;
   a latch unit for latching an output of the control unit; and
   a buffer unit for buffering an output of the latch unit to generate the block selection signal.

7. The semiconductor memory device as recited in claim 6, wherein the input unit includes:
   a first and a second NMOS transistors, serially coupled between a first node and a ground terminal, one of the first and second NMOS transistors having a gate coupled to receive the normal row enable signal and the other of the first and second NMOS transistors having a gate coupled to receive the block selection address signal; and
   a third and a fourth NMOS transistors, coupled between the first node and the ground terminal, one of the third and fourth NMOS transistors having a gate coupled to receive one of the upper and lower spare row enable signals and the other of the third and fourth NMOS transistors having a gate coupled to receive one of the first and second repair summation signals.

8. The semiconductor memory device as recited in claim 7, wherein the control unit includes:
   a PMOS transistor, coupled between a power terminal and a second node, having a gate coupled to receive the fuse precharge signal; and
   an NMOS transistor, coupled between the first node and the second node, having a gate coupled to receive the fuse precharge signal.

9. The semiconductor memory device as recited in claim 8, wherein the latch unit includes:
   a second inverter having an input terminal coupled to the second node; and
   a third inverter having an input terminal coupled to an output terminal of the second inverter and an output terminal coupled to the input. terminal of the first inverter.

10. A semiconductor memory device having a plurality of cell blocks, comprising:
    a fuse box group having a plurality of fuse box pairs, each fuse box pair being coupled to a respective redundant main word line of a cell block, for generating a repair signal in response to a row address signal, wherein the plurality of fuse box pairs includes upper fuse box pairs and lower fuse box pairs;
    a repair signal summation means for generating control signals by decoding output signals of the fuse box group for controlling a repair operation, wherein the control signals include:
       a first control signal generated by decoding output signals of the upper fuse box pairs;
       a second control signal generated by decoding output signals of the lower fuse box pairs; and
       a third control signal generated by decoding output signals of the upper and lower fuse box pairs;
    a block selection signal generation means for generating a block selection signal for selecting a cell block to be repaired in response to the control signals and a block selection address signal; and
    a repair row decoding means for driving a main redundant word line in response to the repair signal and a block selection signal.

11. The semiconductor memory device as recited in claim 10, wherein the repair signal summation means includes:
    a plurality of first NAND gates for NANDing outputs of the upper fuse box pairs and providing a first repair summation signal;
    a plurality of second NAND gates for NANDing outputs of the lower fuse box pairs and providing a second repair summation signal;
    a first NOR gate for NORing outputs of the first NAND gates;
    a second NOR gate for NORing outputs of the second NAND gates;
    a third NAND gate for NANDing an output of the first NOR gate and an output of the second NOR gate;

a first buffer unit for buffering an output of the first NOR gate and generating a lower spare row enable signal as the first control signal;

a second buffer unit for buffering an output of the second NOR gate and generating an upper spare row enable signal as the second control signal; and an inverter for inverting an output of the third NAND gate and generating a normal row enable signal as the third control signal.

12. The semiconductor memory device as recited in claim 11, wherein the block selection signal generation means includes:

an upper block selection signal generation unit for receiving the lower spare row enable signal, the normal row enable signal, the first repair summation signal, and an upper block selection address signal and generating a first block selection signal for selecting an upper cell block to be repaired; and a lower block selection signal generation unit for receiving the upper spare row enable signal, the normal row enable signal, the second repair summation signal, and a lower block selection address signal and generating a second block selection signal for selecting a lower cell block to be repaired.

13. The semiconductor memory device as recited in claim 10, wherein each fuse box includes:

a plurality of fuse elements, each having a first terminal coupled to a common node;

a plurality of NMOS transistors, each NMOS transistor being coupled to a second terminal of a respective one of the fuse elements and having a gate terminal coupled to receive a word line selection address signal;

a PMOS transistor, coupled between a power terminal and the common node, having a gate terminal coupled to receive a fuse precharge signal; and a latch unit for latching and providing a voltage level applied to the common node.

14. The semiconductor memory device as recited in claim 13, wherein the latch unit includes:

an inverter for inverting the voltage level applied to the common node; and a second PMOS transistor, coupled between the power terminal and the common node, having a gate terminal coupled to an output terminal of the inverter.

15. The semiconductor memory device as recited in claim 11, wherein the block selection signal generation means includes:

an input unit for selecting a corresponding cell block in response to the normal row enable signal, at least one of the upper and lower spare row enable signals, at least one of the first and second repair summation signals, and the block selection address signal;

a control unit for controlling an operation of the block selection signal generation means in response to the fuse precharge signal;

a latch unit for latching an output of the control unit; and a buffer unit for buffering an output of the latch unit to generate the block selection signal.

16. The semiconductor memory device as recited in claim 15, wherein the input unit includes:

a first and a second NMOS transistors, serially coupled between a first node and a ground terminal, one of the first and second NMOS transistors having a gate terminal coupled to receive the normal row enable signal, and the other of the first and second NMOS transistors having a gate terminal coupled to receive the block selection address signal; and a third and a fourth NMOS transistors, coupled between the first node and the ground terminal, one of the third and fourth NMOS transistors having a gate terminal coupled to receive one of the upper and lower spare row enable signal, and the other of the third and fourth NMOS transistors having a gate terminal coupled to receive the one of the first and second repair summation signals.

17. The semiconductor memory device as recited in claim 15, wherein the control unit includes:

a PMOS transistor, coupled between a power terminal and a second node, having a gate terminal coupled to receive the fuse precharge signal; and an NMOS transistor, coupled between the first node and the second node, having a gate terminal coupled to receive the fuse precharge signal.

18. The semiconductor memory device as recited in claim 17, wherein the latch unit includes:

a second inverter having an input terminal coupled to the second node; and a third inverter having an input terminal coupled to an output terminal of the second inverter and an output terminal coupled to the input terminal of the first inverter.

19. A block selection circuit for a semiconductor memory device having a plurality of memory cell blocks, comprising:

a first fuse box group configured to generate a plurality of first repair signals;

a second fuse box group configured to generate a plurality of second repair signals;

a first combiner circuit configured to combine the plurality of first repair signals, thereby generating a plurality of first repair summation signals and a second spare row enable signal;

a second combiner circuit configured to combine the plurality of second repair signals, thereby generating a plurality of second repair summation signals and a first spare row enable signal;

a third combiner circuit configured to receive the second and first spare row enable signals and to generate a normal row enable signal; and a block selection signal generator configured to generate a block selection signal in response to the normal row enable signal, at least one of the first and second spare row enable signals, at least one of the plurality of first and second repair summation signals, and a block address signal.

20. The block selection circuit of claim 19, wherein the first combiner circuit comprises:

a plurality of NAND circuits, each NAND circuit having input terminals coupled to receive a pair of the first repair signals and an output terminal for providing a first repair summation signal; and a NOR circuit having a plurality of input terminals, each input terminal coupled to the output terminal of a respective one of the NAND circuits, wherein the second spare row enable signal is generated at an output terminal of the NOR circuit.

21. The block selection circuit of claim 19, wherein the third combiner circuit comprises:

a NAND circuit having input terminals coupled to receive the second and first spare row enable signals and an output terminal; and an inverter coupled to the output terminal of the NAND circuit, wherein the normal row enable signal is generated at an output terminal of the inverter.

22. The block selection circuit of claim 19, wherein the block selection signal generator comprises:

an input unit configured to generate an input signal in response to the normal row enable signal, one of the first and second spare row enable signals, one of the plurality of first and second repair summation signals, and the block address signal;

a control unit configured to generate a control signal in response to a precharge signal; and a signal generation unit configured to generate the block selection signal in response to the input signal and the control signal.

23. The block selection circuit of claim 22, wherein the input unit comprises:

a first and a second NMOS transistor serially coupled between a low voltage and a first node, wherein the first NMOS transistor has a gate terminal coupled to the normal row enable signal and the second NMOS transistor has a gate terminal coupled to the block address signal; and a third and a fourth NMOS transistor serially coupled between the low voltage and the first node, wherein the third NMOS transistor has a gate terminal coupled to one of the first and second spare row enable signals and the fourth NMOS transistor has a gate terminal coupled to one of the plurality of first and second repair summation signals.

24. The block selection circuit of claim 23, wherein the control unit comprises:

a fifth NMOS transistor having a first current flowing terminal coupled to the first node, a second current flowing terminal coupled to a second node, and a gate terminal coupled to the precharge signal; and a PMOS transistor having a first current flowing terminal coupled to the second node, a second current flowing terminal coupled to a high voltage, and a gate terminal coupled to the precharge signal.

25. The block selection circuit of claim 24, wherein the signal generation unit comprises:

a latch having an input terminal coupled to the second node and an output terminal; and a buffer having an input terminal coupled to the output terminal of the latch, wherein the block selection signal appears at an output terminal of the buffer.

\* \* \* \* \*